(12) United States Patent
Markle et al.

(10) Patent No.: US 10,409,172 B2
(45) Date of Patent: Sep. 10, 2019

(54) DIGITAL PHOTOLITHOGRAPHY USING COMPACT EYE MODULE LAYOUT

(71) Applicant: Applied Materials, Inc., Santa Clara, CA (US)

(72) Inventors: David Markle, Pleasanton, CA (US); Thomas Laidig, Richmond, CA (US); Timothy N. Thomas, Portland, OR (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/412,530

(22) Filed: Jan. 23, 2017

(65) Prior Publication Data

US 2017/0219934 A1 Aug. 3, 2017

Related U.S. Application Data (60) Provisional application No. 62/288,259, filed on Jan. 28, 2016.

(51) Int. Cl.
  *G03B 27/52* (2006.01)
  *G03F 7/20* (2006.01)
  (Continued)

(52) U.S. Cl.
  CPC ....... *G03F 7/70641* (2013.01); *G02B 6/0096* (2013.01); *G02B 7/04* (2013.01);
  (Continued)

(58) Field of Classification Search
  CPC .............. G03F 7/70641; G02B 26/083; G02B 27/0025; G02B 6/0008; G02B 6/0096;
  (Continued)

(56) References Cited

U.S. PATENT DOCUMENTS

| 5,825,043 A * | 10/1998 | Suwa ................. G03F 7/70275 250/548 |
| 2002/0089654 A1 | 7/2002 | Ota et al. |
| 2005/0002005 A1* | 1/2005 | Terada ............... G03F 7/70383 355/53 |
| 2005/0102263 A1* | 5/2005 | Kemmoku .......... G03F 7/70525 |

(Continued)

FOREIGN PATENT DOCUMENTS

| EP | 0744665 A1 | 11/1996 |
| NO | 2013/184700 A1 | 12/2013 |

OTHER PUBLICATIONS

Chinese Office Action dated Aug. 11, 2017 for Application No. 201720101928.8.

(Continued)

*Primary Examiner* — Peter B Kim
(74) *Attorney, Agent, or Firm* — Patterson + Sheridan LLP (57) ABSTRACT

Embodiments of the present disclosure generally relate to apparatuses and systems for performing photolithography processes. More particularly, compact apparatuses for projecting an image onto a substrate are provided. In one embodiment, an image projection apparatus includes a light pipe coupled to a first mounting plate, and a frustrated prism assembly, one or more digital micro-mirror devices, one or more beamsplitters, and one or more projection optics, which are coupled to a second mounting plate. The first and second mounting plates are coplanar, such that the image projection apparatus is compact and may be aligned in a system having a plurality of image projection apparatuses, each of which is easily removable and replaceable.

21 Claims, 6 Drawing Sheets

(51) Int. Cl.
*F21V 8/00* (2006.01)
*G02B 7/04* (2006.01)
*G02B 27/00* (2006.01)
*G02F 1/13* (2006.01)
*G02B 7/36* (2006.01)
*G02B 5/04* (2006.01)
*G02B 26/08* (2006.01)

(52) U.S. Cl.
CPC ............ *G02B 7/36* (2013.01); *G02B 27/0025* (2013.01); *G02F 1/1303* (2013.01); *G03F 7/7005* (2013.01); *G03F 7/70075* (2013.01); *G03F 7/70275* (2013.01); *G02B 5/04* (2013.01); *G02B 6/0008* (2013.01); *G02B 26/0833* (2013.01)

(58) Field of Classification Search
CPC .... G02B 5/04; G02B 7/04; G02B 7/36; G02F 1/1303
USPC .......................................................... 355/55
See application file for complete search history.

(56) References Cited

U.S. PATENT DOCUMENTS

| | | | |
|---|---|---|---|
| 2010/0014063 A1* | 1/2010 | Sumi | G02B 3/0012 355/67 |
| 2012/0092636 A1* | 4/2012 | Van Der Mast | G03F 7/70616 355/67 |
| 2012/0300180 A1* | 11/2012 | Jeon | G02B 27/1033 353/81 |
| 2013/0130182 A1* | 5/2013 | Markle | G03B 27/522 430/322 |

OTHER PUBLICATIONS

Japanese Office Action dated Feb. 7, 2017 for Application No. 2017-000070.
Taiwan Office Action dated Apr. 21, 2017 for Application No. 106200240.
Chinese Office Action dated Jul. 20, 2018 for Application No. 201820062228.7.
Chinese Office Action issued to Chinese Application No. 201820062228.7 dated Jul. 20, 2018.

* cited by examiner

DIGITAL PHOTOLITHOGRAPHY USING COMPACT EYE MODULE LAYOUT

CROSS-REFERENCE TO RELATED APPLICATIONS

This application claims benefit of U.S. Provisional Patent Application Ser. No. 62/288,259, filed on Jan. 28, 2016, which is herein incorporated by reference in its entirety.

BACKGROUND

Field

Embodiments of the present disclosure generally relate to apparatuses and systems for processing one or more substrates, and more specifically to apparatuses for performing photolithography processes.

Description of the Related Art

Photolithography is widely used in the manufacturing of semiconductor devices and display devices, such as liquid crystal displays (LCDs). Large area substrates are often utilized in the manufacture of LCDs. LCDs, or flat panels, are commonly used for active matrix displays, such as computers, touch panel devices, personal digital assistants (PDAs), cell phones, television monitors, and the like. Generally, flat panels may include a layer of liquid crystal material forming pixels sandwiched between two plates. When power from the power supply is applied across the liquid crystal material, an amount of light passing through the liquid crystal material may be controlled at pixel locations enabling images to be generated.

Microlithography techniques are generally employed to create electrical features incorporated as part of the liquid crystal material layer forming the pixels. According to these techniques, a light-sensitive photoresist is typically applied to at least one surface of the substrate. Then, a pattern generator exposes selected areas of the light-sensitive photoresist as part of a pattern with light to cause chemical changes to the photoresist in the selective areas to prepare these selective areas for subsequent material removal and/or material addition processes to create the electrical features.

In order to continue to provide display devices and other devices at the prices demanded by consumers, new apparatuses and approaches are needed to precisely and cost-effectively create patterns on substrates, such as large area substrates.

SUMMARY

Embodiments of the present disclosure generally relate to apparatuses and systems for performing photolithography processes. More particularly, compact apparatuses for projecting an image onto a substrate are provided. In one embodiment, an image projection apparatus includes a light pipe coupled to a first mounting plate, and a frustrated prism assembly, one or more digital micro-mirror devices, one or more beamsplitters, and one or more projection optics, which are coupled to a second mounting plate. The first and second mounting plates are coplanar, such that the image projection apparatus is compact and may be aligned in a system having a plurality of image projection apparatuses, each of which is easily removable and replaceable.

In one embodiment, an image projection apparatus is disclosed. The image projection apparatus includes a light pipe, a frustrated prism assembly, one or more digital micro-mirror devices, one or more beamsplitters, one or more projection optics, a focus actuator, and a projection lens.

In another embodiment, an image projection apparatus is disclosed. The image projection apparatus includes a light pipe and a light level sensor adjacent the light pipe. The image projection apparatus further comprises a frustrated prism assembly, one or more digital micro-mirror devices coupled to the frustrated prism assembly, one or more beamsplitters coupled to the frustrated prism assembly, one or more projection optics coupled to the one or more beamsplitters, a focus actuator connected to the second projection optics, and a projection lens coupled to the focus actuator. The projection lens includes a focus group coupled to the focus actuator and a window coupled to the focus group. The image projection apparatus also includes a focus sensor and a camera.

In yet another embodiment, an image projection system is disclosed. The image projection system includes two or more stages and a plurality of image projection apparatuses for projection an image onto one or more substrates. The two or more stages are configured to hold the one or more substrates. Each of the image projection apparatuses includes a light source, a light pipe, a light level sensor, a frustrated prism assembly, one or more digital micro-mirror devices, one or more beamsplitters, one or more projection optics, and a projection lens. The light pipe is coupled to a first mounting plate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, wherever possible, to designate identical elements that are common to the Figures. Additionally, elements of one embodiment may be advantageously adapted for utilization in other embodiments described herein.

DETAILED DESCRIPTION

Embodiments of the present disclosure generally relate to apparatuses and systems for performing photolithography processes. More particularly, compact apparatuses for projecting an image onto a substrate are provided. In one embodiment, an image projection apparatus includes a light pipe coupled to a first mounting plate, and a frustrated prism assembly, one or more beamsplitters, one or more projection optics, and a distortion compensator, which are coupled to a second mounting plate. The first and second mounting plates are coplanar, such that the image projection apparatus is compact and may be aligned in a system having a plurality of image projection apparatuses, each of which is easily removable and replaceable.

Figure 1:
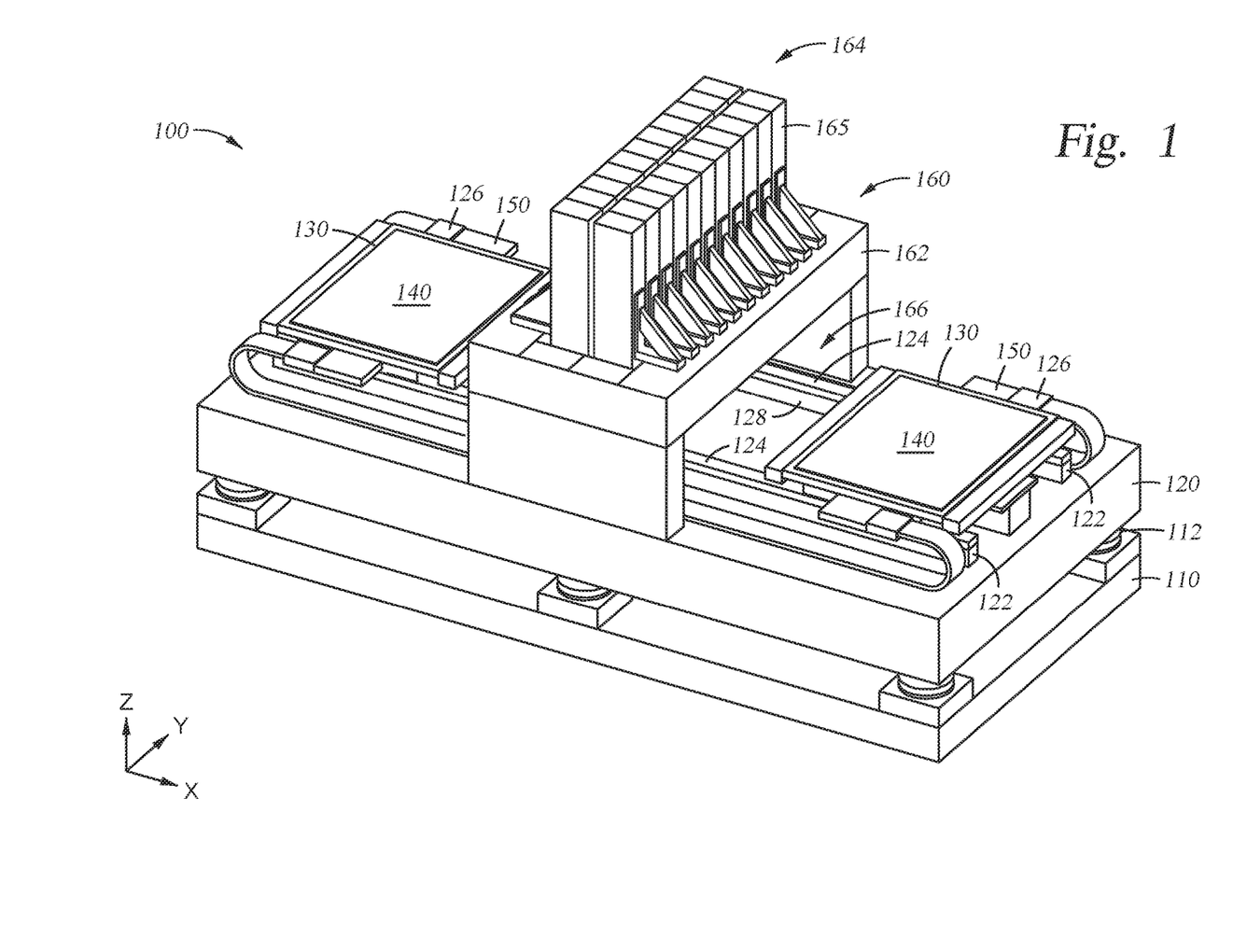
FIG. 1 is a perspective view of a system that may benefit from embodiments disclosed herein.

FIG. 1 is a perspective view of a system 100 that may benefit from embodiments disclosed herein. The system 100 includes a base frame 110, a slab 120, two or more stages 130, and a processing apparatus 160. The base frame 110 may rest on the floor of a fabrication facility and may support the slab 120. Passive air isolators 112 may be positioned between the base frame 110 and the slab 120. The slab 120 may be a monolithic piece of granite, and the two or more stages 130 may be disposed on the slab 120. A substrate 140 may be supported by each of the two or more stages 130. A plurality of holes (not shown) may be formed in the stage 130 for allowing a plurality of lift pins (not shown) to extend therethrough. The lift pins may rise to an extended position to receive the substrate 140, such as from one or more transfer robots (not shown). The one or more transfer robots may be used to load and unload a substrate 140 from the two or more stages 130.

The substrate 140 may, for example, be made of quartz and be used as part of a flat panel display. In other embodiments, the substrate 140 may be made of other materials. In some embodiments, the substrate 140 may have a photoresist layer formed thereon. A photoresist is sensitive to radiation and may be a positive photoresist or a negative photoresist, meaning that portions of the photoresist exposed to radiation will be respectively soluble or insoluble to photoresist developer applied to the photoresist after the pattern is written into the photoresist. The chemical composition of the photoresist determines whether the photoresist will be a positive photoresist or negative photoresist. For example, the photoresist may include at least one of diazonaphthoquinone, a phenol formaldehyde resin, poly(methyl methacrylate), poly(methyl glutarimide), and SU-8. In this manner, the pattern may be created on a surface of the substrate 140 to form the electronic circuitry.

The system 100 may further include a pair of supports 122 and a pair of tracks 124. The pair of supports 122 may be disposed on the slab 120, and the slab 120 and the pair of supports 122 may be a single piece of material. The pair of tracks 124 may be supported by the pair of the supports 122, and the two or more stages 130 may move along the tracks 124 in the X-direction. In one embodiment, the pair of tracks 124 is a pair of parallel magnetic channels. As shown, each track 124 of the pair of tracks 124 is linear. In other embodiments, the track 124 may have a non-linear shape. An encoder 126 may be coupled to each stage 130 in order to provide location information to a controller (not shown).

The processing apparatus 160 may include a support 162 and a processing unit 164. The support 162 may be disposed on the slab 120 and may include an opening 166 for the two or more stages 130 to pass under the processing unit 164. The processing unit 164 may be supported by the support 162. In one embodiment, the processing unit 164 is a pattern generator configured to expose a photoresist in a photolithography process. In some embodiments, the pattern generator may be configured to perform a maskless lithography process. The processing unit 164 may include a plurality of image projection apparatuses (shown in FIGS. 2-3). In one embodiment, the processing unit 164 may contain 84 image projection apparatuses. Each image projection apparatus is disposed in a case 165. The processing apparatus 160 may be utilized to perform maskless direct patterning. During operation, one of the two or more stages 130 moves in the X-direction from a loading position, as shown in FIG. 1, to a processing position. The processing position may refer to one or more positions of the stage 130 as the stage 130 passes under the processing unit 164. During operation, the two or more stages 130 may be lifted by a plurality of air bearings (not shown) and may move along the pair of tracks 124 from the loading position to the processing position. A plurality of vertical guide air bearings (not shown) may be coupled to each stage 130 and positioned adjacent an inner wall 128 of each support 122 in order to stabilize the movement of the stage 130. Each of the two or more stages 130 may also move in the Y-direction by moving along a track 150 for processing and/or indexing the substrate 140. Each of the two or more stages 130 is capable of independent operation and can scan a substrate 140 in one direction and step in the other direction. In some embodiments, when one of the two or more stages 130 is scanning a substrate 140, another of the two or more stages 130 is unloading an exposed substrate and loading the next substrate to be exposed.

A metrology system measures the X and Y lateral position coordinates of each of the two or more stages 130 in real time so that each of the plurality of image projection apparatuses can accurately locate the patterns being written in a photoresist covered substrate. The metrology system also provides a real-time measurement of the angular position of each of the two or more stages 130 about the vertical or Z-axis. The angular position measurement can be used to hold the angular position constant during scanning by means of a servo mechanism or it can be used to apply corrections to the positions of the patterns being written on the substrate 140 by the image projection apparatus 390, shown in FIG. 3. These techniques may be used in combination.

Figure 2:
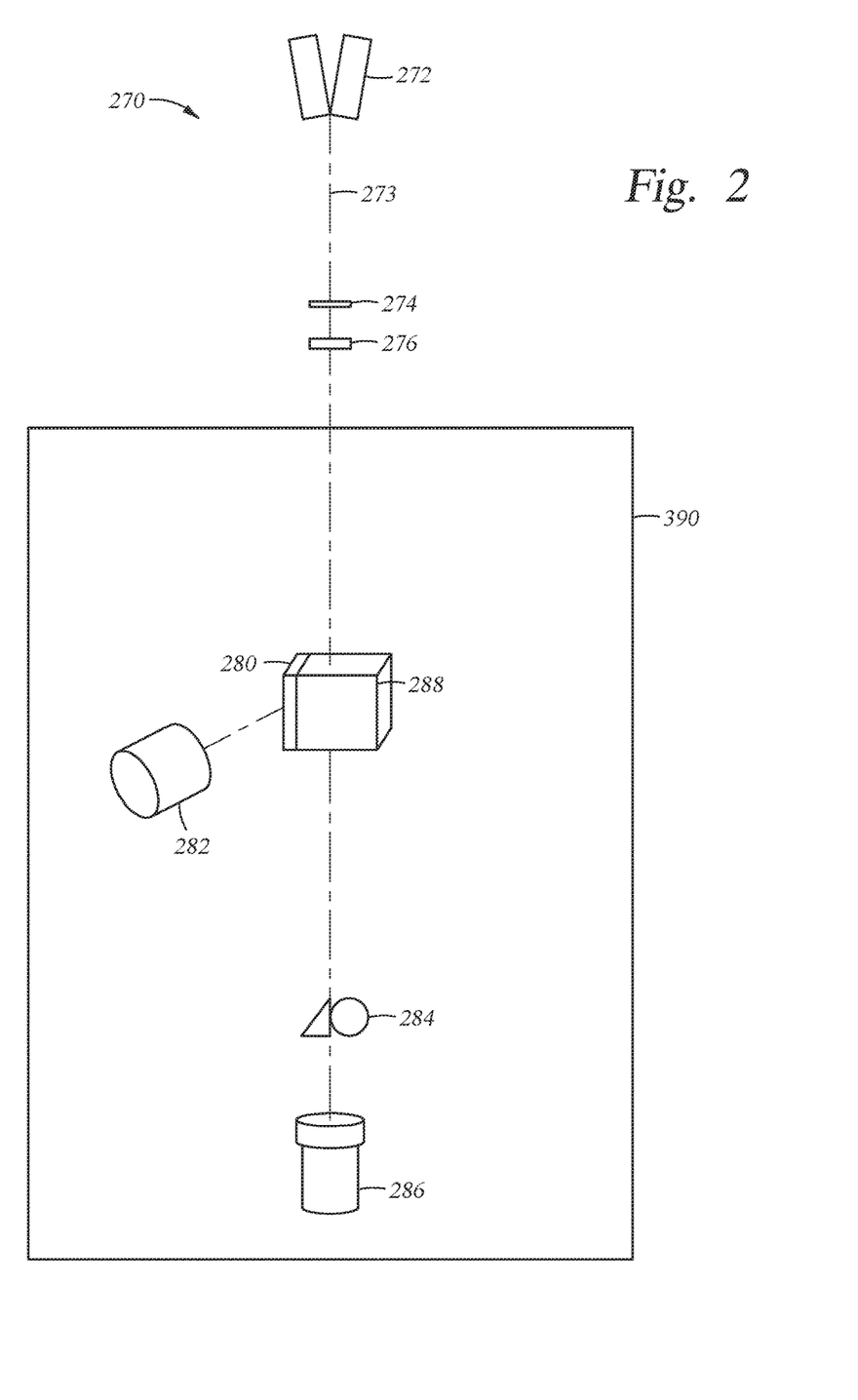
FIG. 2 is a perspective schematic view of an image projection system according to one embodiment.

FIG. 2 is a perspective schematic view of an image projection system 270 according to one embodiment. The image projection system 270 may include a light source 272, an aperture 274, a lens 276, a frustrated prism assembly 288, one or more digital micro-mirror devices (DMDs) 280 (one is shown), a light dump 282, a focus sensor and camera 284, and a projection lens 286. The frustrated prism assembly 288, the DMD 280, the focus sensor and camera 284, and the projection lens 286 may be part of an image projection apparatus 390 (shown in FIG. 3). The light source 272 may be a light emitting diode (LED) or a laser, and the light source 272 may be capable of producing a light having predetermined wavelength. In one embodiment, the predetermined wavelength is in the blue or near ultraviolet (UV) range, such as less than about 450 nm. The frustrated prism assembly 288 may include a plurality of reflective surfaces. The projection lens 286 may be a 10× objective lens. The DMD 280 may include a plurality of mirrors, and the number of mirrors may correspond to the resolution of the projected image. In one embodiment, the DMD 280 includes 1920×1080 mirrors, which represent the number of pixels of a high definition television.

During operation, a light beam 273 having a predetermined wavelength, such as a wavelength in the blue range, is produced by the light source 272. The light beam 273 is reflected to the DMD 280 by the frustrated prism assembly 288. The DMD 280 includes a plurality of mirrors that may be controlled individually, and each mirror of the plurality of mirrors of the DMD 280 may be at "on" position or "off" position, based on the mask data provided to the DMD 280 by the controller (not shown). When the light beam 273 reaches the mirrors of the DMD 280, the mirrors that are at "on" position reflect the light beam 273, i.e., forming the plurality of write beams, to the projection lens 286. The projection lens 286 then projects the write beams to the surface 304 of the substrate 140. The mirrors that are at "off" position reflect the light beam 273 to the light dump 282 instead of the surface of the substrate 140.

Figure 3:
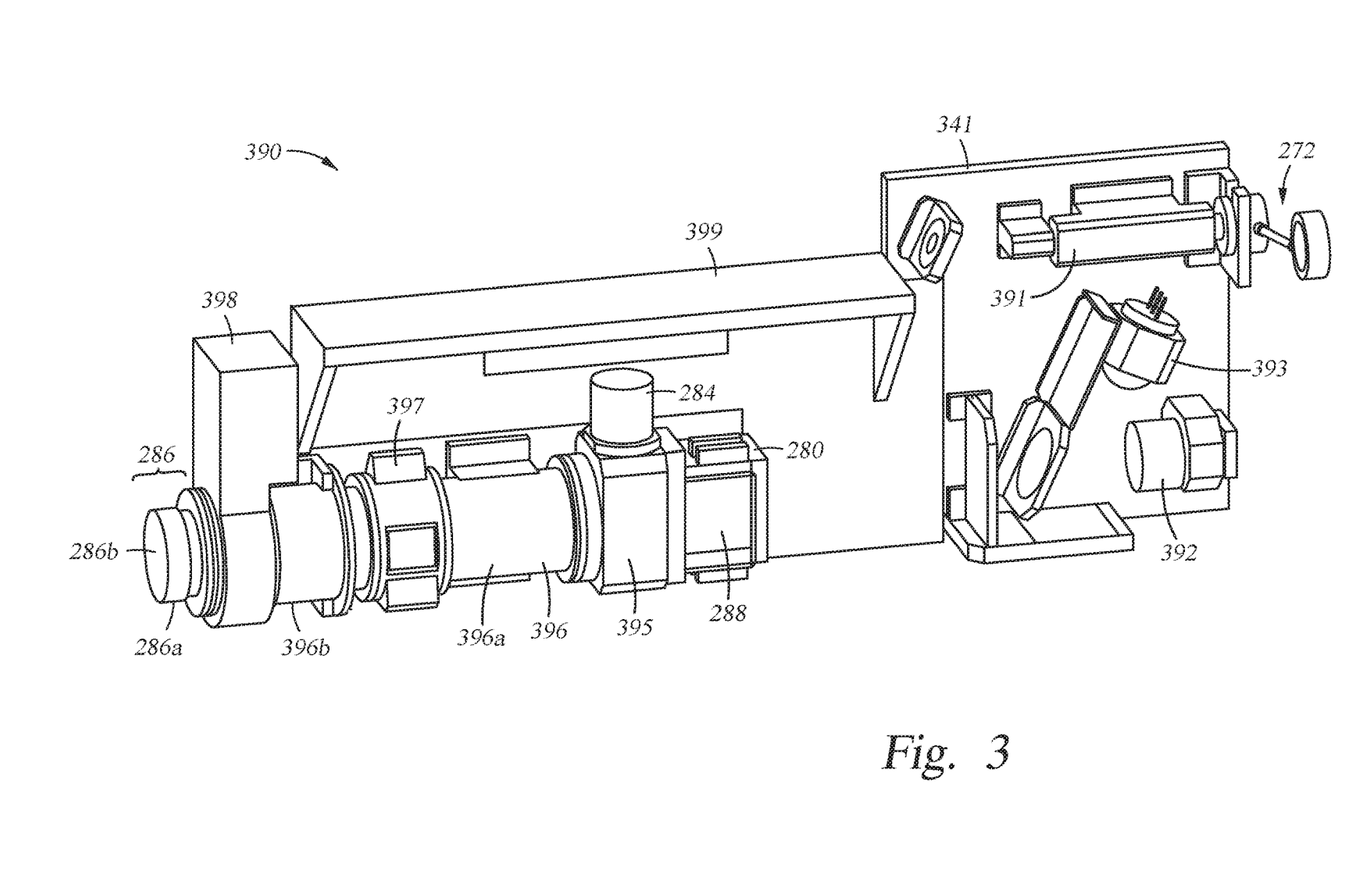
FIG. 3 is a perspective view of an image projection apparatus according to one embodiment.

FIG. 3 is a perspective view of an image projection apparatus 390 according to one embodiment. The image projection apparatus 390 is used to focus light to a certain spot on a vertical plane of a substrate 140 and to ultimately project an image onto that substrate 140. The image projection apparatus 390 includes two subsystems. The image projection apparatus 390 includes an illumination system and a projection system. The illumination system includes at least a light pipe 391 and a non-actinic light source 392. In one example, the non-actinic light source 392 may be a white light illumination device. The projection system includes one or more DMDs 280 (one is shown), a frustrated prism assembly 288, one or more beamsplitters 395 (one is shown), one or more projection optics 396a, 396b, a distortion compensator 397, a focus actuator 398 and a projection lens 286. The projection lens 286 includes a focus group 286a and a window 286b.

Light is introduced to the image projection apparatus 390 from the light source 272. The light source 272 may be an actinic light source. For example, the light source 272 may be a bundle of fibers, each fiber containing one laser. In one embodiment, the light source 272 may be a bundle of about 100 fibers. The bundle of fibers may be illuminated by laser diodes. The light source 272 is coupled to the light pipe (or kaleido) 391. In one embodiment, the light source 272 is coupled to the light pipe 391 through a combiner, which combines each of the fibers of the bundle.

Once light (shown as light beam 273 in FIGS. 2, 5, and 7) from the light source 272 enters into the light pipe 391, the light bounces around inside the light pipe 391 such that the light is homogenized and uniform when it exits the light pipe 391. The light may bounce in the light pipe 391 up to six or seven times. In other words, the light goes through six to seven total internal reflections within the light pipe 391, which results in the output of uniform light.

The image projection apparatus 390 may optionally include various reflective surfaces (not labeled). The various reflective surfaces capture some of the light traveling through the image projection apparatus 390. In one embodiment, the various reflective surfaces may capture some light and then help direct the light to a light level sensor 393 so that the laser level may be monitored.

The non-actinic light source 392 projects broad-band visible light, which has been homogenized by the light pipe 391, into the projection system of image projection apparatus 390. Specifically, the non-actinic light source 392 directs the light to the frustrated prism assembly 288 and ultimately illuminates the DMD 280 mirror array 632. The actinic and broad-band light sources may be turned on and off independently of one another.

Figure 5:
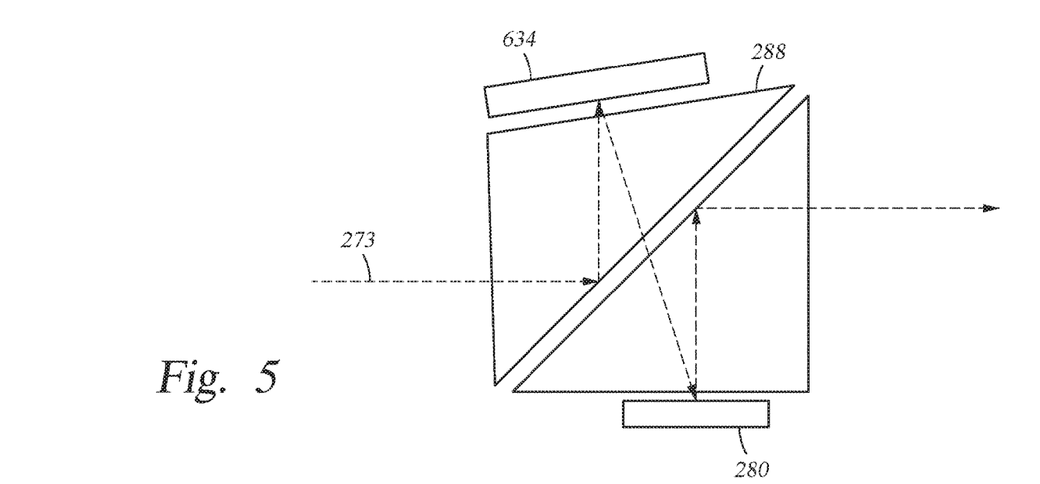
FIG. 5 is a schematic view of a frustrated prism assembly according to one embodiment.

The frustrated prism assembly 288 functions to filter the light that will be projected onto the surface of the substrate 140. Specifically, light, shown as light beam 273, bounces between the reflective surfaces inside of the frustrated prism assembly 288 as shown in FIG. 5. The light beam 273 is separated into light that will be projected onto the substrate 140 and light that will not. Use of the frustrated prism assembly 288 results in minimum energy loss because the total internal reflected light goes out. The frustrated prism assembly 288 is coupled to a beamsplitter 395.

Figure 4:
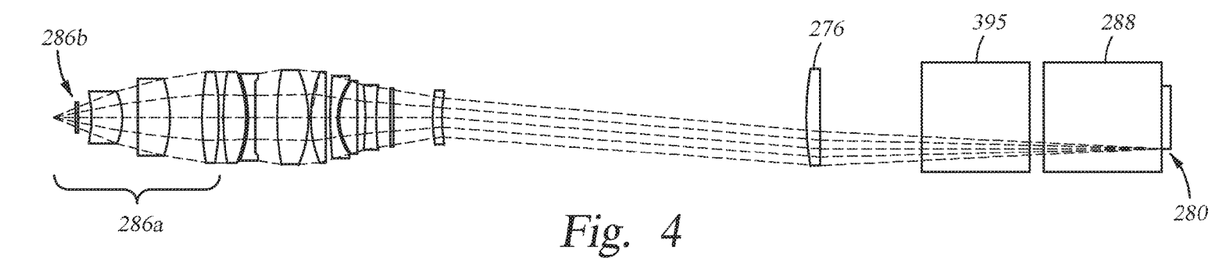
FIG. 4 is a cross-sectional view of the optical relays according to one embodiment.

Throughput is an important parameter of any lithography system. To achieve a high throughput, each image projection apparatus 390 may be designed to be as narrow as possible in at least one direction so that many image projection apparatuses 390 can be packed together in the width of a substrate 140. The use of the frustrated prism assembly 288 allows for a highly efficient yet compact optical relay as shown in FIG. 4.

Figure 6:
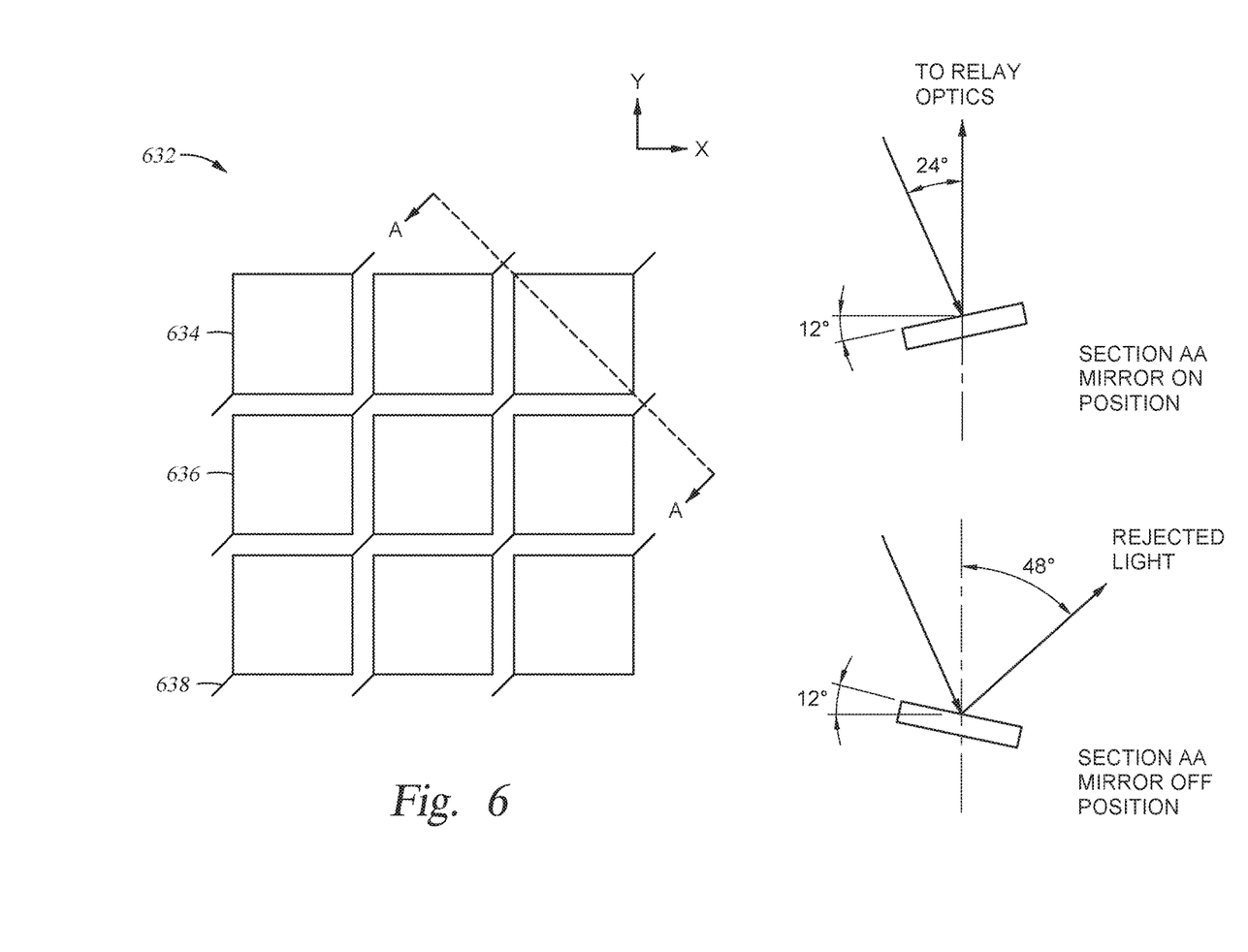
FIG. 6 is a schematic view of a mirror array of a digital micro-mirror device according to one embodiment.

A DMD 280 is included as part of the frustrated cube assembly. The (DMD) 280 is the imaging device of the image projection apparatus 390. The DMD 280 includes a plurality of micro-mirrors 634 arranged in a mirror array 632 (as shown in FIG. 6). The edges 636 of micro-mirrors 634 are arranged along orthogonal axes, which may be the X axis and the Y axis. These axes are congruent with similar axis referenced to the substrate 140 or a stage coordinate system after taking into account a 90 degree fold introduced by the frustrated prism assembly 288. However, the hinges 638 on each micro-mirror 634 are located on opposing corners of each mirror causing it to pivot on axis at 45 degrees to the X axis and Y axis. These micro-mirrors 634 can be switched between on and off positions by varying the angle of tilt of the mirror. Depending on whether the light hits a mirror that is turned on or off, the light will either be sent through the rest of the image projection system 270, or it will be unused, respectively. In one embodiment, the unused light is directed to and stored in a light dump 282, as shown in FIG. 2. In one embodiment, the DMD 280 is made such that the only stable position for each micro-mirror 634 is at a tilt angle of plus or minus 12 degrees with respect to the surface of the mirror array 632. In order to reflect incident light normal to the surface of the mirror array 632, the incident light has to be incident at twice the mirror tilt angle (24 degrees) and in an incident plane rotated at 45 degrees with respect to the X and Y axes. The DMD 280 is positioned to be flat to the projection of the substrate 140.

It is difficult to show compound angles in the 2D schematic of the mirror array 632 in DMD 280 shown in FIG. 6, but the illumination axis and the axis of the projection system are offset from each other in the plane of the schematic and the plane containing the normal to the DMD 280 and the adjustment mirror normal is rotated at 45 degrees to the DMD X and Y axis. With this arrangement, light reflected from an on micro-mirror 634 is normal to the plane of the DMD 280 and is folded into the projection relay, which images it onto the substrate 140.

The micro-mirrors 634 are used to adjust the incidence angle of the illumination beam on the DMD 280 so that after reflection the on beam is aimed down the center of the image projection apparatus 390 and the image created in the illumination system is centered in the projection system.

Use of the DMD 280 and frustrated prism assembly 288 help to minimize the footprint of each image projection apparatus 390 by keeping the direction of the flow of illumination roughly normal to the substrate 140 all the way from the light source 272 that generates the exposure illumination to the substrate focal plane.

The beamsplitter 395 is used to further extract light for alignment. More specifically, the beamsplitter 395 is used to split the light into two or more separate beams. The beamsplitter 395 is coupled to the one or more projection optics 396. Two projection optics 396a, 396b are shown in FIG. 3.

Figure 7:
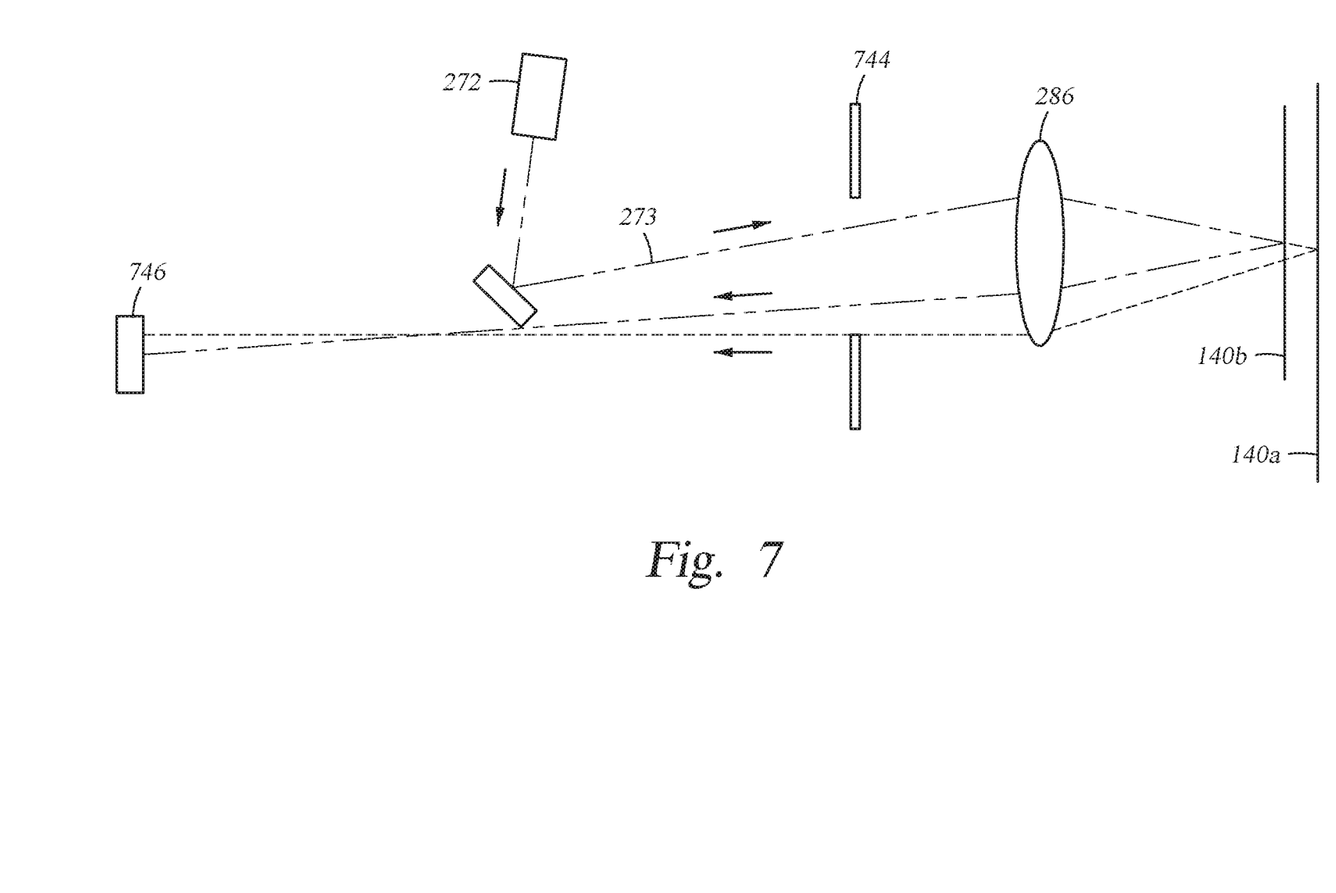
FIG. 7 is a schematic view of a focus sensing mechanism according to one embodiment.

In one embodiment, a focus sensor and camera 284 are attached to the beamsplitter 395. The focus sensor and camera 284 may be configured to monitor various aspects of the imaging quality of the image projection apparatus 390, including, but not limited to, through lens focus and alignment, as well as mirror tilt angle variation. Additionally, the focus sensor and camera 284 may show the image, which is going to be projected onto the substrate 140. In further embodiments, the focus sensor and camera 284 may be used to capture images on the substrate 140 and make a comparison between those images. In other words, the focus sensor and camera 284 may be used to perform inspection functions. Specifically, as shown in FIG. 7, a narrow light beam 273 is directed through one side of the pupil 744 in the projection lens 286. The light beam 273 strikes the substrate 140 at an oblique angel and is reflected back so that it traverses the opposite side of the pupil 744. An image projection detector 746 accurately measures the lateral position of the return image. A change in the focus position of the substrate 140 causes the image position on the image projection detector 746 to change. The change is proportional to the amount of defocus and the direction of image motion. Any deviation from the nominal position is converted into an analogue signal, proportional to the deviation, which is used to change the position of the projection lens 286, which brings the defocused substrate 140a back into good focus, shown as substrate 140b. In one embodiment, the focus sensor and camera 284 is attached to a surface of the beam splitter 395.

Together the projection optics 396, the distortion compensator 397, the focus actuator 398, and the projection lens 286 prepare for and ultimately project the image from the DMD 280 onto the substrate 140. Projection optics 396a is coupled to the distortion compensator 397. The distortion compensator 397 is coupled to projection optics 396b, which is coupled to the focus actuator 398. The focus actuator 398 is coupled to the projection lens 286. The projection lens 286 includes a focus group 286a and a window 286b. The focus group 286a is coupled to the window 286b. The window 286b may be replaceable.

The light pipe 391 and the non-actinic light source 392 are coupled to a first mounting plate 341. Additionally, in embodiments including additional various reflective surfaces (not labeled) and a light level sensor 393, the various reflective surfaces and the light level sensor 393 may also be coupled to the first mounting plate 341.

The frustrated prism assembly 288, one or more beamsplitters 395, one or more projection optics 396a, 396b and distortion compensator 397 are coupled to a second mounting plate 399. The first mounting plate 341 and the second mounting plate 399 are planar, which allows for precise alignment of the aforementioned components of the image projection apparatus 390. In other words, light travels through the image projection apparatus 390 along a single optical axis. This precise alignment along a single optical axis results in an apparatus that is compact. For example, the image projection apparatus 390 may have a thickness of between about 80 mm and about 100 mm.

Accordingly, one benefit of the present disclosure is the ability to align multiple compact image projection apparatuses in a single tool. Furthermore, each of the image projection apparatuses is easily removable and replaceable, resulting in reduced down time for maintenance.

While the foregoing is directed to embodiments of the present disclosure, other and further embodiments of the disclosure may be devised without departing from the basic scope thereof, and the scope thereof is determined by the claims that follow.

What is claimed is:

1. An image projection apparatus, comprising:
   a light pipe;
   a frustrated prism assembly;
   one or more digital micro-mirror devices coupled to a first side of the frustrated prism assembly;
   a tilted micro-mirror coupled to a second side of the frustrated prism assembly, the second side being opposite the first side;
   one or more beamsplitters coupled to the frustrated prism assembly;
   one or more projection optics coupled to the one or more beamsplitters;
   a focus actuator;
   a projection lens coupled to the focus actuator, the projection lens comprising:
      a focus group comprising at least two lenses; and
      a window;
      wherein the focus group is coupled to the window; and
   a projection detector coupled to the focus actuator.

2. The image projection apparatus of claim 1, further comprising:
   a non-actinic light source; and
   a light level sensor.

3. The image projection apparatus of claim 2, further comprising:
   a first mounting plate, wherein the light pipe and non-actinic light source are coupled to the first mounting plate; and
   a second mounting plate, wherein the frustrated prism assembly, the one or more digital micro-mirror devices, the one or more beamsplitters, and the one or more projection optics are coupled to the second mounting plate, and wherein the first and second mounting plates are co-planar.

4. The image projection apparatus of claim 3, further comprising:
   a distortion compensator.

5. The image projection apparatus of claim 1, further comprising:
   a focus sensor; and
   a camera.

6. The image projection apparatus of claim 1, further comprising:
   a light dump.

7. The image projection apparatus of claim 1 further comprising:
   a substrate support; and
   wherein the projection detector is configured to detect a state of focus of a substrate upon the substrate support, via the projection lens.

8. An image projection apparatus, comprising:
   a light pipe;
   a light level sensor adjacent the light pipe;
   a frustrated prism assembly;
   one or more digital micro-mirror devices coupled to a first side of the frustrated prism assembly;
   a tilted micro-mirror coupled to a second side of the frustrated prism assembly, the second side being opposite the first side;
   one or more beamsplitters coupled to the frustrated prism assembly;
   a focus sensor coupled to the one or more beamsplitters;
   a camera coupled to the one or more beamsplitters;
   one or more projection optics coupled to the one or more beamsplitters;
   a focus actuator connected to the one or more projection optics;

a projection lens coupled to the focus actuator, the projection lens comprising:
  a focus group comprising at least two lenses coupled to the focus actuator; and
  a window coupled to the focus group
a projection detector coupled to the focus actuator.

9. The image projection apparatus of claim 8, further comprising:
a non-actinic light source adjacent the light level sensor.

10. The image projection apparatus of claim 9, wherein the focus sensor and the camera are coupled to a surface of the one or more beamsplitters.

11. The image projection apparatus of claim 9, wherein the light pipe and the non-actinic light source are coupled to a first mounting plate.

12. The image projection apparatus of claim 11, wherein the light pipe, the light level sensor, the frustrated prism assembly, the one or more beamsplitters, and the one or more projection optics are coupled to a second mounting plate.

13. The image projection apparatus of claim 12, wherein the first and second mounting plates are co-planar.

14. The image projection apparatus of claim 8, further comprising:
a distortion compensator coupled to the one or more projection optics.

15. The image projection apparatus of claim 8 further comprising:
a substrate support; and
wherein the projection detector is configured to detect a state of focus of a substrate upon the substrate support, via the projection lens.

16. An image projection system, comprising:
two or more stages, wherein the two or more stages are each configured to hold one or more substrates; and
a plurality of image projection apparatuses for patterning the one or more substrates, wherein each image projection apparatus comprises:
  a light pipe;
  a frustrated prism assembly;
  one or more digital micro-mirror devices coupled to a first side of the frustrated prism assembly;
  a tilted micro-mirror coupled to a second side of the frustrated prism assembly, the second side being opposite the first side;
  one or more beamsplitters coupled to the frustrated prism assembly;
  one or more projection optics coupled to the one or more beamsplitters;
  a focus actuator;
  a projection lens coupled to the focus actuator, the projection lens comprising:
    a focus group comprising at least two lenses; and
    a window, wherein the window is coupled to the focus group; and
  a projection detector coupled to the focus actuator.

17. The image projection system of claim 16, wherein each image projection apparatus further comprises:
a non-actinic light source; and
a light level sensor.

18. The image projection system of claim 17, wherein the light pipe and non-actinic light source are coupled to a first mounting plate.

19. The image projection system of claim 16, wherein each image projection apparatus further comprises:
a focus sensor; and
a camera.

20. The image projection system of claim 16, wherein each image projection apparatus further comprises:
a light dump.

21. The image projection system of claim 16 further comprising:
a substrate support; and
wherein the projection detector is configured to detect a state of focus of a substrate upon the substrate support, via the projection lens.

* * * * *